(12) United States Patent
Agustin et al.

(10) Patent No.: US 12,732,751 B2
(45) Date of Patent: Sep. 8, 2026

(54) VOLUME MANAGEMENT IN A MEDIA PLAYBACK SYSTEM

(71) Applicant: Sonos, Inc., Santa Barbara, CA (US)

(72) Inventors: Jerome Agustin, Camarillo, CA (US); Jonathan P. Lang, Santa Barbara, CA (US); Mark W. Triplett, St. Charles, IL (US)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 18/479,172

(22) Filed: Oct. 2, 2023

(65) Prior Publication Data

US 2024/0284102 A1 Aug. 22, 2024

Related U.S. Application Data

(63) Continuation of application No. 17/520,912, filed on Nov. 8, 2021, now Pat. No. 11,778,378, which is a (Continued)

(51) Int. Cl.

*H04R 3/12* (2006.01)
*G06F 3/16* (2006.01)

(Continued)

(52) U.S. Cl.

CPC ............... *H04R 3/12* (2013.01); *G06F 3/167* (2013.01); *H03G 3/001* (2013.01); *H03G 3/20* (2013.01);

(Continued)

(58) Field of Classification Search

CPC ....... H04R 3/12; H04R 2430/01; G06F 3/167; H03G 3/001; H03G 3/20; H03G 3/3005; H03G 3/3089; H03G 2201/50

(Continued)

(56) References Cited

U.S. PATENT DOCUMENTS 5,182,552 A 1/1993 Paynting
5,239,458 A 8/1993 Suzuki (Continued)

FOREIGN PATENT DOCUMENTS

EP 1389853 A1 2/2004
WO 200153994 7/2001

(Continued)

OTHER PUBLICATIONS

Advisory Action mailed on May 22, 2018, issued in connection with U.S. Appl. No. 14/940,699, filed Nov. 13, 2015, 3 pages.

(Continued)

*Primary Examiner* — Carolyn R Edwards
*Assistant Examiner* — Friedrich Fahnert
(74) *Attorney, Agent, or Firm* — Akerman LLP

(57) ABSTRACT

Example techniques may provide volume enhancements to a media playback system. An example implementation involves a first playback device in a first playback configuration playing audio at a first volume level and storing the first volume level in association with the first playback configuration. The first playback device receives instructions to change to a second playback configuration. Based on receiving the instructions, the first playback device joins a synchrony group with a second zone and adjusts the first playback device to play audio at a second volume level which is based on a volume level of a second playback device in the second zone. While in the second playback configuration, the first playback device receives instructions to change to the first playback configuration and, based on the instructions, leaves the synchrony group and adjusts the first playback device to play audio content at the stored first volume level.

20 Claims, 12 Drawing Sheets

Related U.S. Application Data continuation of application No. 16/740,751, filed on Jan. 13, 2020, now Pat. No. 11,172,296, which is a continuation of application No. 16/055,582, filed on Aug. 6, 2018, now Pat. No. 10,536,777, which is a continuation of application No. 14/940,699, filed on Nov. 13, 2015, now Pat. No. 10,045,123, which is a continuation of application No. 14/039,312, filed on Sep. 27, 2013, now Pat. No. 9,231,545.

(51) Int. Cl.
*H03G 3/00* (2006.01)
*H03G 3/20* (2006.01)
*H03G 3/30* (2006.01)

(52) U.S. Cl.
CPC ......... *H03G 3/3005* (2013.01); *H03G 3/3089* (2013.01); *H03G 2201/50* (2013.01); *H04R 2430/01* (2013.01)

(58) Field of Classification Search
USPC ........................................................... 381/77
See application file for complete search history.

(56) References Cited

U.S. PATENT DOCUMENTS 5,299,266 A 3/1994 Lumsden
5,406,634 A 4/1995 Anderson et al.
5,440,644 A 8/1995 Farinelli et al.
5,751,819 A 5/1998 Dorrough
5,761,320 A 6/1998 Farinelli et al.
5,923,902 A 7/1999 Inagaki
6,026,150 A 2/2000 Frank et al.
6,032,202 A 2/2000 Lea et al.
6,256,554 B1 7/2001 DiLorenzo
6,404,811 B1 6/2002 Cvetko et al.
6,430,353 B1 8/2002 Honda et al.
6,469,633 B1 10/2002 Wachter
6,487,296 B1 11/2002 Allen et al.
6,522,886 B1 2/2003 Youngs et al.
6,611,537 B1 8/2003 Edens et al.
6,631,410 B1 10/2003 Kowalski et al.
6,728,531 B1 4/2004 Lee et al.
6,757,517 B2 6/2004 Chang
6,778,869 B2 8/2004 Champion
6,826,283 B1 11/2004 Wheeler et al.
7,130,608 B2 10/2006 Hollstrom et al.
7,130,616 B2 10/2006 Janik
7,143,939 B2 12/2006 Henzerling
7,218,708 B2 5/2007 Berezowski et al.
7,236,773 B2 6/2007 Thomas
7,295,548 B2 11/2007 Blank et al.
7,312,785 B2 12/2007 Tsuk et al.
7,319,764 B1 1/2008 Reid et al.
7,483,538 B2 1/2009 McCarty et al.
7,571,014 B1* 8/2009 Lambourne ............ G06F 3/165 700/94
7,630,501 B2 12/2009 Blank et al.
7,643,894 B2 1/2010 Braithwaite et al.
7,657,910 B1 2/2010 McAulay et al.
7,668,990 B2 2/2010 Krzyzanowski et al.
7,672,470 B2 3/2010 Lee
7,742,740 B2 6/2010 Goldberg et al.
7,853,341 B2 12/2010 McCarty et al.
7,987,294 B2 7/2011 Bryce et al.
8,005,243 B2 8/2011 Terada et al.
8,014,423 B2 9/2011 Thaler et al.
8,045,952 B2 10/2011 Qureshey et al.
8,050,203 B2 11/2011 Jacobsen et al.
8,050,652 B2 11/2011 Qureshey et al.
8,095,694 B2 1/2012 Rostaing et al.
8,103,009 B2 1/2012 McCarty et al.
8,107,639 B2 1/2012 Moeller et al.
8,131,390 B2 3/2012 Braithwaite et al.
8,218,790 B2 7/2012 Bull et al.
8,234,395 B2 7/2012 Millington
8,290,603 B1 10/2012 Lambourne
8,300,866 B2 10/2012 Lee
8,483,853 B1 7/2013 Lambourne
8,588,949 B2 11/2013 Lambourne et al.
8,611,559 B2 12/2013 Sanders
8,885,851 B2 11/2014 Westenbroek
8,917,877 B2 12/2014 Haaff et al.
9,052,810 B2 6/2015 Reimann et al.
9,164,532 B2 10/2015 Millington
9,438,193 B2 9/2016 Dizon et al.
9,654,073 B2 5/2017 Apodaca
2001/0042107 A1 11/2001 Palm
2002/0003548 A1 1/2002 Krusche et al.
2002/0022453 A1 2/2002 Balog et al.
2002/0026442 A1 2/2002 Lipscomb et al.
2002/0109710 A1 8/2002 Holtz et al.
2002/0124097 A1 9/2002 Isely et al.
2002/0165921 A1 11/2002 Sapieyevski
2002/0188762 A1 12/2002 Tomassetti et al.
2003/0020763 A1 1/2003 Mayer et al.
2003/0023741 A1 1/2003 Tomassetti et al.
2003/0157951 A1 8/2003 Hasty, Jr.
2003/0210796 A1 11/2003 Mccarty et al.
2004/0008852 A1 1/2004 Also et al.
2004/0010727 A1 1/2004 Fujinami
2004/0015252 A1 1/2004 Aiso et al.
2004/0024478 A1 2/2004 Hans et al.
2004/0131192 A1 7/2004 Metcalf
2005/0047605 A1 3/2005 Lee et al.
2005/0289224 A1 12/2005 Deslippe et al.
2007/0038999 A1 2/2007 Millington
2007/0142022 A1 6/2007 Madonna et al.
2007/0142944 A1 6/2007 Goldberg et al.
2008/0118086 A1 5/2008 Krig
2009/0228919 A1 9/2009 Zott et al.
2010/0292818 A1 11/2010 Ramsay
2011/0169755 A1* 7/2011 Murphy .................. G06F 9/451 345/173
2013/0076651 A1 3/2013 Reimann et al.
2013/0148825 A1 6/2013 Fukuma
2013/0191749 A1* 7/2013 Coburn, IV .......... G06F 3/0482 715/716
2013/0243199 A1* 9/2013 Kallai .................... G11B 19/02 381/17
2014/0075311 A1 3/2014 Boettcher et al.
2015/0055801 A1* 2/2015 Wu ......................... G06F 3/165 381/107
2016/0080866 A1* 3/2016 Agustin ................. H03G 3/001 381/77
2019/0313143 A1 10/2019 Mackay et al.

FOREIGN PATENT DOCUMENTS

WO 2003093950 A2 11/2003
WO 2005013047 A2 2/2005

OTHER PUBLICATIONS

Advisory Action mailed on May 23, 2018, issued in connection with U.S. Appl. No. 14/940,699, filed Nov. 13, 2015, 5 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Final Office Action mailed on Feb. 1, 2018, issued in connection with U.S. Appl. No. 14/940,699, filed Nov. 13, 2015, 17 pages.

(56) References Cited

OTHER PUBLICATIONS

Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Motorola, "Simplefi, Wireless Digital Audio Receiver, Installation and User Guide," Dec. 31, 2001, 111 pages.
Non-Final Office Action mailed on Apr. 26, 2019, issued in connection with U.S. Appl. No. 16/055,582, filed Aug. 6, 2018, 5 pages.
Non-Final Office Action mailed on Feb. 26, 2021, issued in connection with U.S. Appl. No. 16/740,751, filed Jan. 13, 2020, 25 pages.
Non-Final Office Action mailed on Sep. 7, 2017, issued in connection with U.S. Appl. No. 14/940,699, filed Nov. 13, 2015, 13 pages.
Non-Final Office Action mailed on Jan. 9, 2023, issued in connection with U.S. Appl. No. 17/520,912, filed Nov. 8, 2021, 21 pages.
Notice of Allowance mailed Jul. 16, 2021, issued in connection with U.S. Appl. No. 16/740,751, filed Jan. 13, 2020, 7 pages.
Notice of Allowance mailed on Sep. 10, 2019, issued in connection with U.S. Appl. No. 16/055,582, filed Aug. 6, 2018, 7 pages.
Notice of Allowance mailed on Jun. 18, 2018, issued in connection with U.S. Appl. No. 14/940,699, filed Nov. 13, 2015, 7 pages.
Notice of Allowance mailed on May 30, 2023, issued in connection with U.S. Appl. No. 17/520,912, filed Nov. 8, 2021, 7 pages.
Notice of Allowance mailed on Sep. 25, 2015, issued in connection with U.S. Appl. No. 14/039,312, filed Sep. 27, 2013, 8 pages.
Palm, Inc., "Handbook for the Palm VII Handheld," May 2000, 311 pages.
Polycom Conference Composer User Guide, copyright 2001, 29 pages.
Presentations at WinHEC 2000, May 2000, 138 pages.
PRISMIQ, Inc., "PRISMIQ Media Player User Guide," 2003, 44 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

VOLUME MANAGEMENT IN A MEDIA PLAYBACK SYSTEM

CROSS REFERENCE TO RELATED APPLICATIONS

This application is a continuation of and claims priority to U.S. application Ser. No. 17/520,912, titled "Volume Management in a Media Playback System,", filed on Nov. 8, 2021, and currently pending; U.S. application Ser. No. 17/520,912 is a continuation of U.S. application Ser. No. 16/740,751, titled "Volume Management in a Media Playback System,", filed on Jan. 13, 2020, and issued on Nov. 9, 2021, as U.S. Pat. No. 11,172,296; U.S. application Ser. No. 16/740,751 is a continuation of U.S. application Ser. No. 16/055,582, titled "Volume Management in a Media Playback System,", filed on Aug. 6, 2018, and issued on Jan. 14, 2020, as U.S. Pat. No. 10,536,777; U.S. application Ser. No. 16/055,582 is a continuation of U.S. application Ser. No. 14/940,699, titled "Playback Device Volume Management, ", filed on Nov. 13, 2015, and issued on Aug. 7, 2018, as U.S. Pat. No. 10,045,123; and U.S. application Ser. No. 14/940,699 is a continuation of U.S. application Ser. No. 14/039,312, titled "Volume Enhancements in a Multi-Zone Media Playback System,", filed on Nov. 27, 2013, and issued on Jan. 5, 2016, as U.S. Pat. No. 9,231,545. The entire contents of U.S. application Ser. Nos. 17/520,912; 16/740,751; 16/055,582; and 14/940,699 are incorporated herein by reference.

FIELD OF THE DISCLOSURE

The disclosure is related to consumer goods and, more particularly, to methods, systems, products, features, services, and other items directed to media playback or some aspect thereof.

BACKGROUND

Digital music has become readily available due in part to the development of consumer level technology that has allowed people to listen to digital music on a personal audio device. The consumer's increasing preference for digital audio has also resulted in the integration of personal audio devices into PDAs, cellular phones, and other mobile devices. The portability of these mobile devices has enabled people to take the music listening experience with them and outside of the home. People have also become able to consume digital music, like digital music files or even Internet radio, in the home through the use of their computer or similar devices. Now there are many different ways to consume digital music, in addition to other digital content including digital video and photos, stimulated in many ways by high-speed Internet access at home, mobile broadband Internet access, and the consumer's hunger for digital media.

Until recently, options for accessing and listening to digital audio in an out-loud setting were severely limited. In 2005, Sonos offered for sale its first digital audio system that enabled people to, among many other things, access virtually unlimited sources of audio via one or more networked connected zone players, dynamically group or ungroup zone players upon command, wirelessly send the audio over a local network amongst zone players, and play the digital audio out loud across multiple zone players in synchrony. The Sonos system can be controlled by software applications running on network capable mobile devices and computers.

Given the insatiable appetite of consumers towards digital media, there continues to be a need to develop consumer technology that revolutionizes the way people access and consume digital media.

BRIEF DESCRIPTION OF THE DRAWINGS

Features, aspects, and advantages of the presently disclosed technology may be better understood with regard to the following description, appended claims, and accompanying drawings where:

Figure 1:
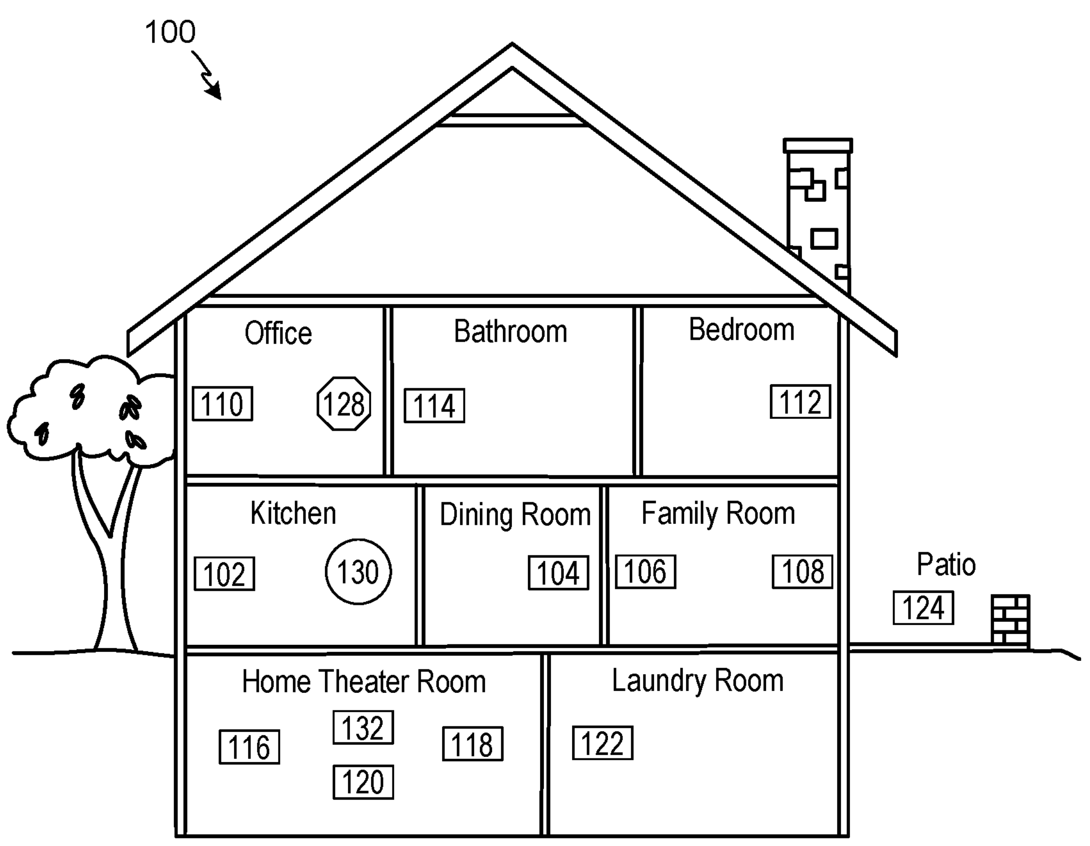
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Embodiments described herein are directed to numerous volume enhancements for a media playback system, and are particularly useful in a multi-zone media playback system, where zone players are capable of being grouped to form one or more synchronous audio playback groups. A media playback system that provides a user with the option via a controller to dynamically group and ungroup various zone players is a desirable feature, but calls for management of different system variables, such as volume level(s). The present application describes volume enhancements that significantly improve volume setting in such systems.

II. Example Operating Environment

Referring now to the drawings, in which like numerals can refer to like parts throughout the figures, FIG. 1 shows an example media playback system configuration 100 in which one or more embodiments disclosed herein can be practiced or implemented.

By way of illustration, the media playback system configuration 100 is associated with a home having multiple zones, although it should be understood that the home could be configured with only one zone. Additionally, one or more zones can be added to the configuration 100 over time. Each zone may be assigned by a user to a different room or space, such as, for example, an office, bathroom, bedroom, kitchen, dining room, family room, home theater room, utility or laundry room, and patio. A single zone might also include multiple rooms or spaces if so configured. With respect to FIG. 1, one or more of zone players 102-124 are shown in each respective zone. Zone players 102-124, also referred to herein as playback devices, multimedia units, speakers, players, and so on, provide audio, video, and/or audiovisual output. A controller 130 (e.g., shown in the kitchen for purposes of this illustration) provides control to the media system configuration 100. Controller 130 may be fixed to a zone, or alternatively, mobile such that it can be moved about the zones. The media system configuration 100 may also include more than one controller 130, and additional controllers may be added to the system over time.

The media system configuration 100 illustrates an example whole house media system, though it is understood that the technology described herein is not limited to, among other things, its particular place of application or to an expansive system like a whole house media system 100 of FIG. 1.

a. Example Zone Players

Figure 2A:
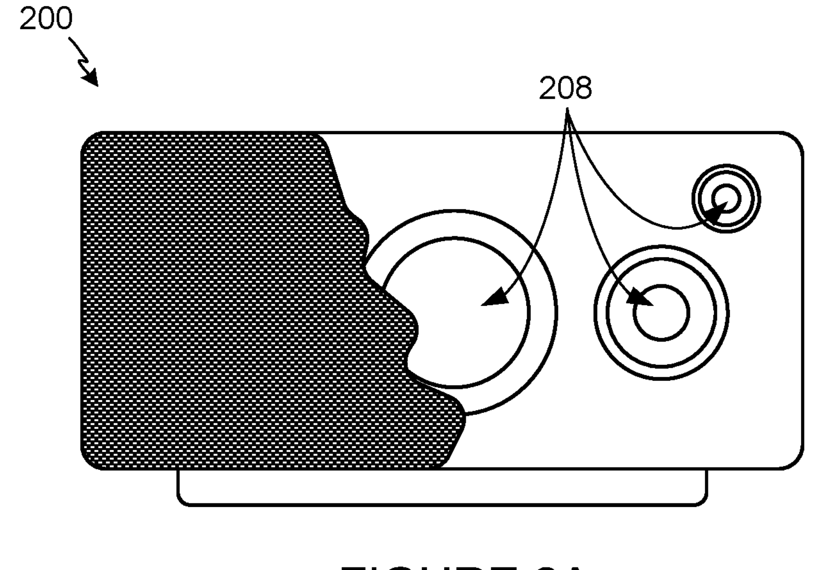
FIG. 2A shows an illustration of an example zone player having built-in amplifiers and transducers.
Figure 2B:
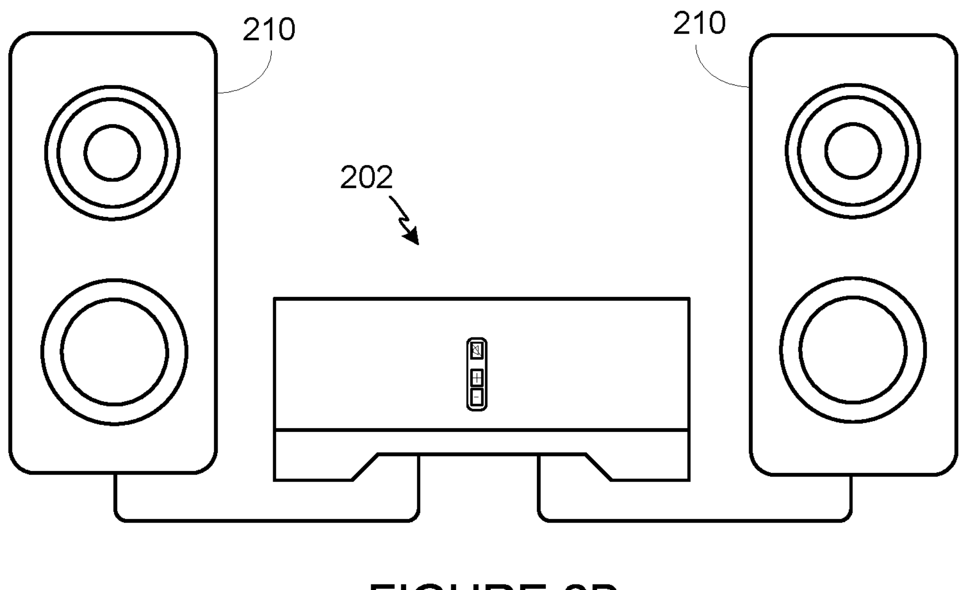
FIG. 2B shows an illustration of an example zone player having a built-in amplifier and connected to external speakers.
Figure 2C:
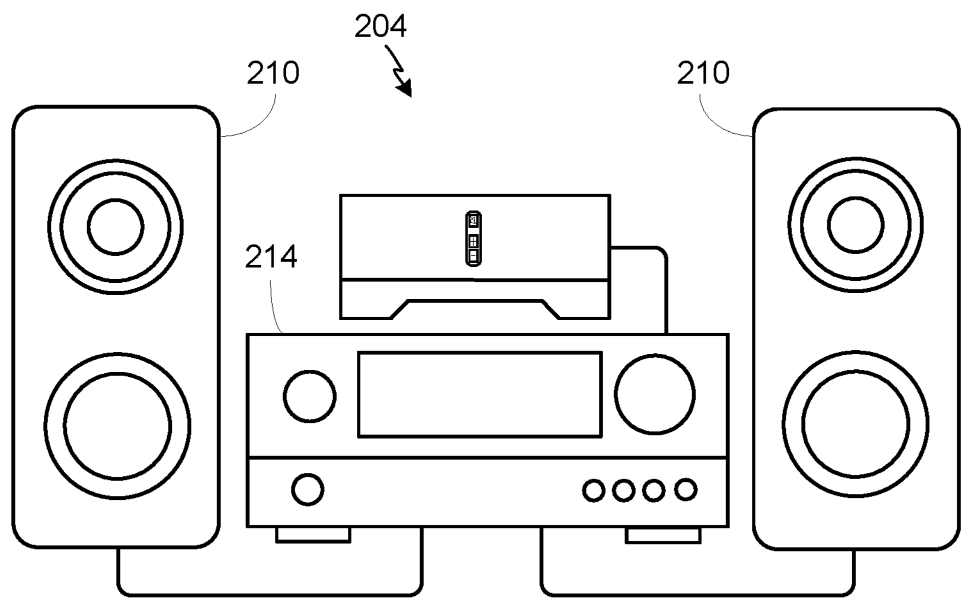
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates a zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 may be dynamically configured to reproduce a subset of full-range sound, such as when zone player 200 is grouped with other zone players to play stereophonic audio, monaural audio, and/or surround audio or when the media content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a particular zone player in a zone or zone group may be assigned to a playback queue (or "queue"). The playback queue contains information corresponding to zero or more audio items for playback by the associated zone or zone group. The playback queue may be stored in memory on a zone player or some other designated device. Each item contained in the playback queue may comprise a uniform resource identifier (URI) or some other identifier that can be used by the zone player(s) to seek out and/or retrieve the audio items from the identified audio source(s). Depending on the item, the audio source might be found on the Internet (e.g., the cloud), locally from another device over the data network 128 (described further below), from the controller 130, stored on the zone player itself, or from an audio source communicating directly to the zone player. In some embodiments, the zone player can reproduce the audio itself (e.g., play the audio), send the audio to another zone player for reproduction, or both where the audio is reproduced by the zone player as well as one or more additional zone players (possibly in synchrony). In some embodiments, the zone player may play a first audio content (or alternatively, may not play the content at all), while sending a second, different audio content to another zone player(s) for reproduction. To the user, each item in a playback queue is represented on an interface of a controller by an element such as a track name, album name, radio station name, playlist, or other some other representation. A user can populate the playback queue with audio items of interest. The user may also modify and clear the playback queue, if so desired.

By way of illustration, SONOS, Inc. of Santa Barbara, California presently offers for sale zone players referred to as a "PLAY:5," "PLAY:3," "PLAYBAR," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player may include or interact with a docking station for an Apple iPod™ or similar device.

b. Example Controllers

Figure 3:
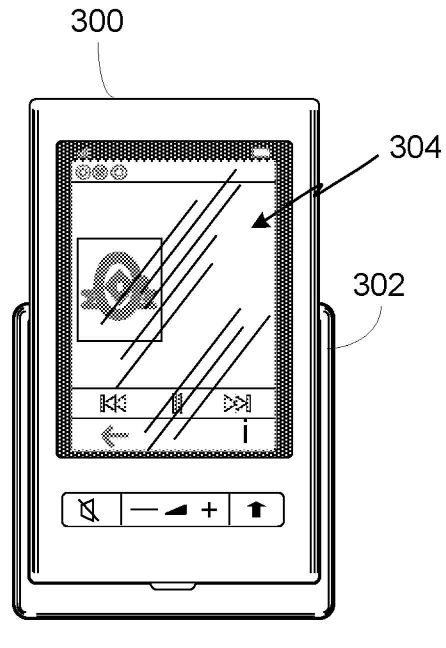
FIG. 3 shows an illustration of an example controller.

FIG. 3 illustrates an example wireless controller 300 in docking station 302. By way of illustration, controller 300 may correspond to controlling device 130 of FIG. 1. Docking station 302, if provided or used, may provide power to the controller 300 and additionally may charge a battery of controller 300. In some embodiments, controller 300 may be provided with a touch screen 304 that allows a user to interact through touch with the controller 300, for example, to retrieve and navigate a playlist of audio items, modify and/or clear the playback queue of one or more zone players, control other operations of one or more zone players, and provide overall control of the system configuration 100. In other embodiments, other input mechanisms such as voice control may be used to interact with the controller 300. In certain embodiments, any number of controllers can be used to control the system configuration 100. In some embodiments, there may be a limit set on the number of controllers that can control the system configuration 100. The controllers might be wireless like wireless controller 300 or wired to data network 128.

In some embodiments, if more than one controller is used in system 100 of FIG. 1, each controller may be coordinated to display common content, and may all be dynamically updated to indicate changes made to the system 100 from a single controller. Coordination can occur, for instance, by a controller periodically requesting a state variable directly or indirectly from one or more of the zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an iPhone™, iPad™, Android™ powered phone or tablet, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers, which have been offered by Sonos, Inc. of Santa Barbara, California include a "Controller 200," "SONOS® CONTROL," "SONOS® Controller for iPhone™," "SONOS® Controller for iPad™," "SONOS® Controller for Android™," "SONOS® Controller for Mac™ or PC."

c. Example Data Connection

Zone players 102-124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players are coupled to data network 128 using a centralized access point such as a wired or wireless router. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a type of secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, a "bonded zone" contains two or more zone players, such as the two zone players 106 and 108 in the family room, whereby the two zone players 106 and 108 can be configured to play the same audio source in synchrony. In one example, the two zone players 106 and 108 can be paired to play two separate sounds in left and right channels, for example. In other words, the stereo effects of a sound can be reproduced or enhanced through the two zone players 106 and 108, one for the left sound and the other for the right sound. In another example two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player has additional speaker drivers from which sound can be passed. The consolidated zone player can further be paired with a single zone player or yet another consolidated zone player. Each playback device of a consolidated playback device can be set in a consolidated mode, for example.

In certain embodiments, paired or consolidated zone players (also referred to as "bonded zone players") can play audio in synchrony with other zone players in the same or different zones.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for an individual to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, audio on a zone player itself may be accessed and played. In some embodiments, audio on a controller may be accessed via the data network 128 and played. In some embodiments, music from a personal library stored on a computer or networked-attached storage (NAS) may be accessed via the data network 128 and played. In some embodiments, Internet radio stations, shows, and podcasts may be accessed via the data network 128 and played. Music or cloud services that let a user stream and/or download music and audio content may be accessed via the data network 128 and played. Further, music may be obtained from traditional sources, such as a turntable or CD player, via a line-in connection to a zone player, for example. Audio content may also be accessed using a different protocol, such as Airplay™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 may be shared with any of the zone players 102-124 in the audio system 100.

III. Example Zone Players

Figure 4:
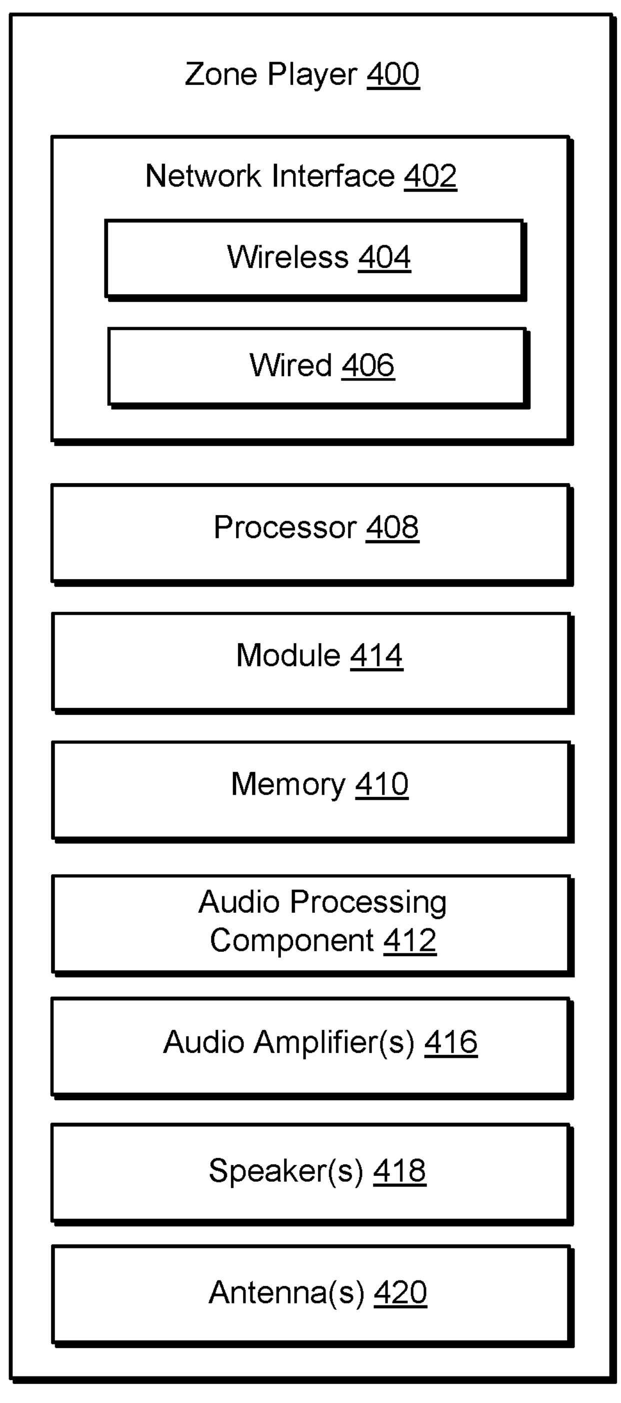
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, 802.11ac, 802.15, 4G mobile communication standard, and so on). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for playback through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Example Controller

Figure 5:
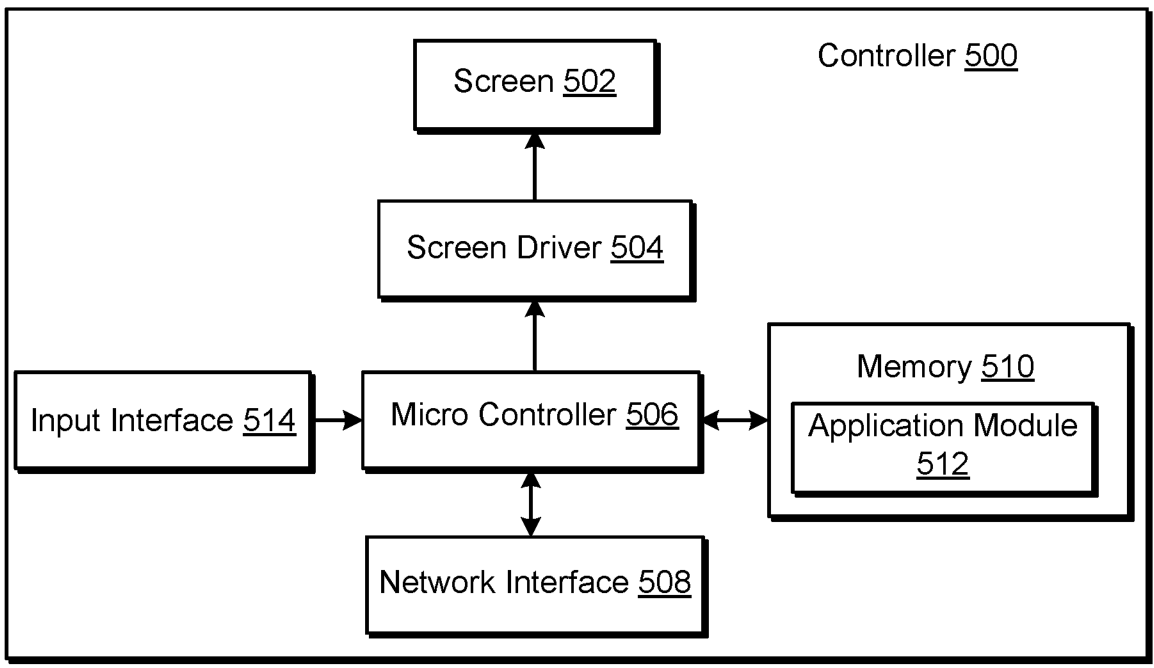
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.11ac, 802.15, 4G mobile communication standard, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group to facilitate synchronized playback amongst the zone players in the zone group. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an iPhone™, iPad™ or any other smart phone or network-enabled device (e.g., a networked computer such as a PC or Mac™) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group playback an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio playback is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer. In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed or learned action. Other kinds of zone scenes can be programmed or learned by the system over time.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration and revert the zones to their prior configuration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Playback Queue

As discussed above, in some embodiments, a zone player may be assigned to a playback queue identifying zero or more media items for playback by the zone player. The media items identified in a playback queue may be represented to the user via an interface on a controller. For instance, the representation may show the user (or users if more than one controller is connected to the system) how the zone player is traversing the playback queue, such as by highlighting the "now playing" item, graying out the previously played item(s), highlighting the to-be-played item(s), and so on.

In some embodiments, a single zone player is assigned to a playback queue. For example, zone player 114 in the bathroom of FIG. 1 may be linked or assigned to a "Bathroom" playback queue. In an embodiment, the "Bathroom" playback queue might have been established by the system as a result of the user naming the zone player 114 to the bathroom. As such, contents populated and identified in the "Bathroom" playback queue can be played via the zone player 114 (the bathroom zone).

In some embodiments, a zone or zone group is assigned to a playback queue. For example, zone players 106 and 108 in the family room of FIG. 1 may be linked or assigned to a "Family room" playback queue. In another example, if family room and dining room zones were grouped, then the new group would be linked or assigned to a family room+dining room playback queue. In some embodiments, the family room+dining room playback queue would be established based upon the creation of the group. In some embodiments, upon establishment of the new group, the family room+dining room playback queue can automatically include the contents of one (or both) of the playback queues associated with either the family room or dining room or both. In one instance, if the user started with the family room and added the dining room, then the contents of the family room playback queue would become the contents of the family room+dining room playback queue. In another instance, if the user started with the family room and added the dining room, then the family room playback queue would be renamed to the family room+dining room playback queue. If the new group was "ungrouped," then the family room+dining room playback queue may be removed from the system and/or renamed to one of the zones (e.g., renamed to "family room" or "dining room"). After ungrouping, each of the family room and the dining room will be assigned to a separate playback queue. One or more of the zone players in the zone or zone group may store in memory the associated playback queue.

As such, when zones or zone groups are "grouped" or "ungrouped" dynamically by the user via a controller, the system will, in some embodiments, establish or remove/rename playback queues respectively, as each zone or zone group is to be assigned to a playback queue. In other words, the playback queue operates as a container that can be populated with media items for playback by the assigned zone. In some embodiments, the media items identified in a playback queue can be manipulated (e.g., re-arranged, added to, deleted from, and so on).

Figure 6:
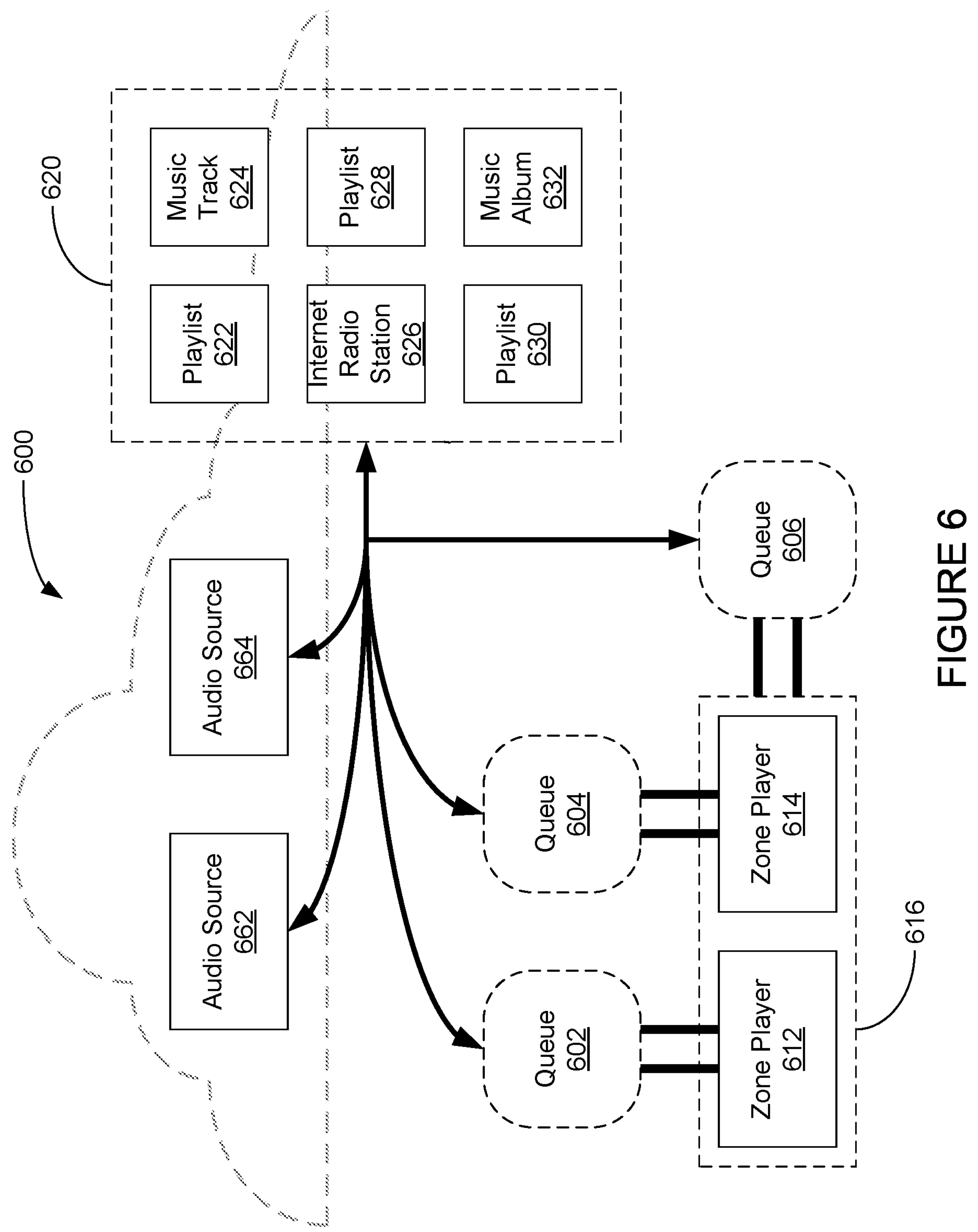
FIG. 6 shows an example playback queue configuration for a media playback system.

By way of illustration, FIG. 6 shows an example network 600 for media content playback. As shown, the example network 600 includes example zone players 612 and 614, example audio sources 662 and 664, and example media items 620. The example media items 620 may include playlist 622, music track 624, favorite Internet radio station 626, playlists 628 and 630, and album 632. In one embodiment, the zone players 612 and 614 may be any of the zone players shown in FIGS. 1, 2, and 4. For instance, zone players 612 and 614 may be the zone players 106 and 108 in the Family Room.

In one example, the example audio sources 662 and 664, and example media items 620 may be partially stored on a cloud network, discussed more below in connection to FIG. 8. In some cases, the portions of the audio sources 662, 664, and example media items 620 may be stored locally on one or both of the zone players 612 and 614. In one embodiment, playlist 622, favorite Internet radio station 626, and playlist 630 may be stored locally, and music track 624, playlist 628, and album 632 may be stored on the cloud network.

Each of the example media items 620 may be a list of media items playable by a zone player(s). In one embodiment, the example media items may be a collection of links or pointers (i.e., URI) to the underlying data for media items that are stored elsewhere, such as the audio sources 662 and 664. In another embodiment, the media items may include pointers to media content stored on the local zone player, another zone player over a local network, or a controller device connected to the local network.

As shown, the example network 600 may also include an example queue 602 associated with the zone player 612, and an example queue 604 associated with the zone player 614. Queue 606 may be associated with a group, when in existence, comprising zone players 612 and 614. Queue 606 might comprise a new queue or exist as a renamed version of queue 602 or 604. In some embodiments, in a group, the zone players 612 and 614 would be assigned to queue 606 and queue 602 and 604 would not be available at that time. In some embodiments, when the group is no longer in existence, queue 606 is no longer available. Each zone player and each combination of zone players in a network of zone players, such as those shown in FIG. 1 or that of example zone players 612, 614, and example combination 616, may be uniquely assigned to a corresponding playback queue.

A playback queue, such as playback queues 602-606, may include identification of media content to be played by the corresponding zone player or combination of zone players. As such, media items added to the playback queue are to be played by the corresponding zone player or combination of zone players. The zone player may be configured to play items in the queue according to a specific order (such as an order in which the items were added), in a random order, or in some other order.

The playback queue may include a combination of playlists and other media items added to the queue. In one embodiment, the items in playback queue 602 to be played by the zone player 612 may include items from the audio sources 662, 664, or any of the media items 622-632. The playback queue 602 may also include items stored locally on the zone player 612, or items accessible from the zone player 614. For instance, the playback queue 602 may include Internet radio 626 and album 632 items from audio source 662, and items stored on the zone player 612.

When a media item is added to the queue via an interface of a controller, a link to the item may be added to the queue. In a case of adding a playlist to the queue, links to the media items in the playlist may be provided to the queue. For example, the playback queue 602 may include pointers from the Internet radio 626 and album 632, pointers to items on the audio source 662, and pointers to items on the zone player 612. In another case, a link to the playlist, for example, rather than a link to the media items in the playlist may be provided to the queue, and the zone player or combination of zone players may play the media items in the playlist by accessing the media items via the playlist. For example, the album 632 may include pointers to items stored on audio source 662. Rather than adding links to the items on audio source 662, a link to the album 632 may be added to the playback queue 602, such that the zone player 612 may play the items on the audio source 662 by accessing the items via pointers in the album 632.

In some cases, contents as they exist at a point in time within a playback queue may be stored as a playlist, and subsequently added to the same queue later or added to another queue. For example, contents of the playback queue 602, at a particular point in time, may be saved as a playlist, stored locally on the zone player 612 and/or on the cloud network. The saved playlist may then be added to playback queue 604 to be played by zone player 614.

VI. Example Ad-Hoc Network

Figure 7:
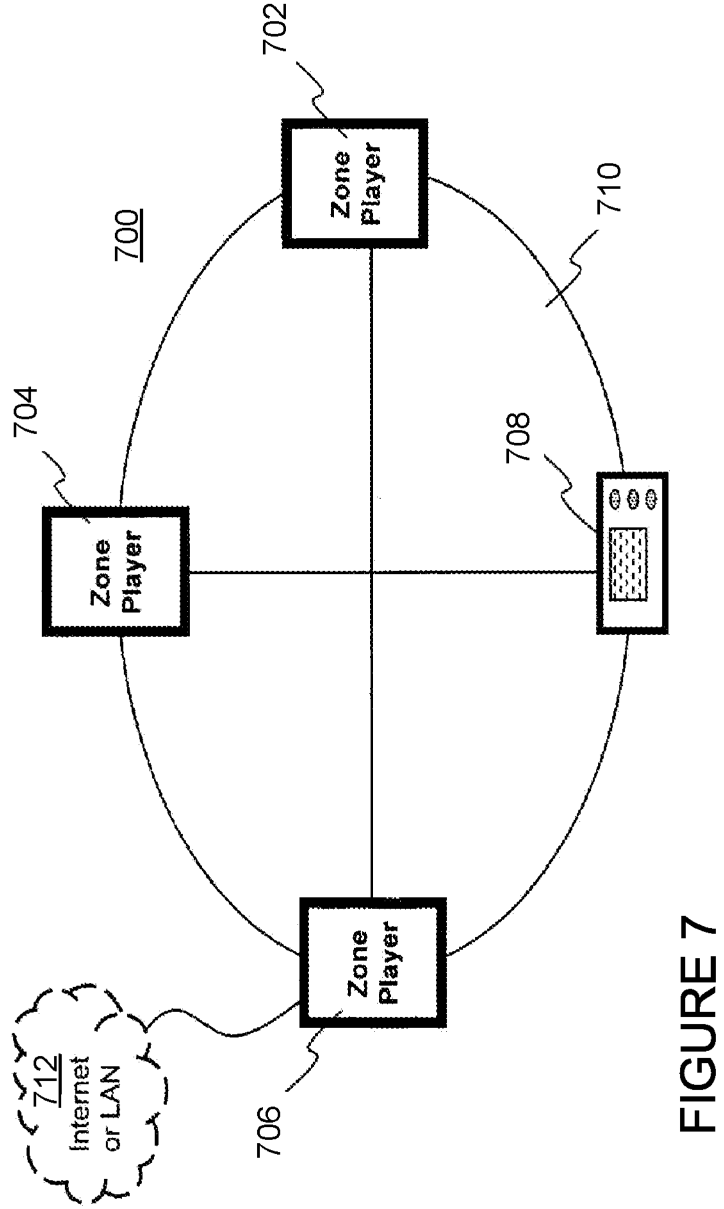
FIG. 7 shows an example ad-hoc playback network.

Particular examples are now provided in connection with FIG. 7 to describe, for purposes of illustration, certain embodiments to provide and facilitate connection to a media playback system (e.g., such as system 100 shown in FIG. 1). FIG. 7 shows that there are three zone players 702, 704 and 706 and a controller 708 that form a network branch that is also referred to as an Ad-Hoc network 710. The network 710 may be wireless, wired, or a combination of wired and wireless technologies. In general, an Ad-Hoc (or "spontaneous") network is a local area network or other small network in which there is generally no one access point for all traffic. With an established Ad-Hoc network 710, the devices 702, 704, 706 and 708 can all communicate with each other in a "peer-to-peer" style of communication, for example. Furthermore, devices may join and/or leave from the network 710, and the network 710 will automatically reconfigure itself without needing the user to reconfigure the network 710. While an Ad-Hoc network is referenced in FIG. 7, it is understood that a playback network may be based on a type of network that is completely or partially different from an Ad-Hoc network.

Using the Ad-Hoc network 710, the devices 702, 704, 706, and 708 can share or exchange one or more audio sources and be dynamically grouped (or ungrouped) to play the same or different audio sources. For example, the devices 702 and 704 are grouped to playback one piece of music, and at the same time, the device 706 plays back another piece of music. In other words, the devices 702, 704, 706 and 708, as shown in FIG. 7, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 710 (or household identifier), though a HOUSEHOLD may be identified with a different area or place.

In certain embodiments, a household identifier (HHID) is a short string or an identifier that is computer-generated to help ensure that it is unique. Accordingly, the network 710 can be characterized by a unique HHID and a unique set of configuration variables or parameters, such as channels (e.g., respective frequency bands), service set identifier (SSID) (a sequence of alphanumeric characters as a name of a wireless network), and WEP keys (wired equivalent privacy) or other security keys. In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., security keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 706 in FIG. 7 is shown to be connected to both networks, for example. The connectivity to the network 712 is based on Ethernet and/or Wireless, while the connectivity to other devices 702, 704 and 708 is based on Wireless and Ethernet if so desired.

It is understood, however, that in some embodiments each zone player 706, 704, 702 may access the Internet when retrieving media from the cloud (e.g., the Internet) via the bridging device. For example, zone player 702 may contain a uniform resource locator (URL) that specifies an address to a particular audio track in the cloud. Using the URL, the zone player 702 may retrieve the audio track from the cloud, and ultimately play the audio out of one or more zone players.

VII. Another Example System Configuration

Figure 8:
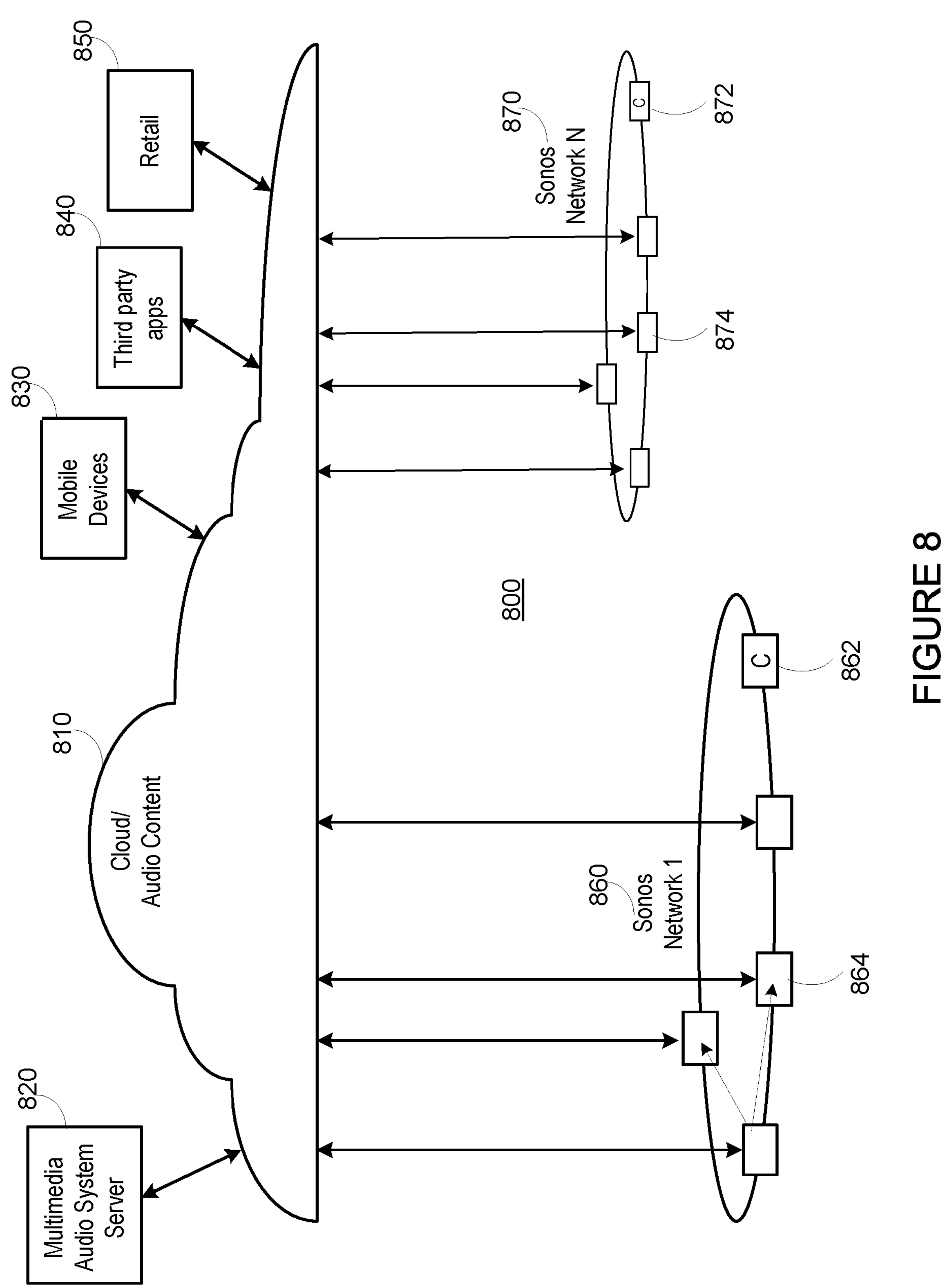
FIG. 8 shows a system including a plurality of networks including a cloud-based network and at least one media playback system.

FIG. 8 shows a system 800 including a plurality of interconnected networks including a cloud-based network and at least one media playback system (e.g., like system 100 in FIG. 1). The at least one media playback system includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 800 of FIG. 8, a plurality of content providers 820-850 can be connected to one or more local playback networks 860-870 via a cloud and/or other network 810. Using the cloud 810, a multimedia audio system server 820 (e.g., Sonos™), a mobile device 830, a third party application 840, a content provider 850 and so on can provide multimedia content (requested or otherwise) to local playback networks 860, 870. Within each local playback network 860, 870, a controller 862, 872 and a playback device 864, 874 can be used to playback audio content.

VIII. Volume Enhancement Embodiments

As described above, in some embodiments, various systems illustrated above advantageously allow for dynamic user configuration of one or more zone groups between two or more zone players for each group. Groups of varying size can be constructed and destructed upon command. In some embodiments, each group includes a group volume and each zone player of the group may have its own, individual volume setting, which is based on changes in the group volume. As such, changing a group volume may cause a direct change to a zone player volume setting (and vice-versa) and affect playback even when the zone player is no longer a part of the group. In the embodiments described herein, to improve the user experience in grouping and ungrouping zone players, volume settings of the zone players are more intelligently applied by the system.

Figure 9:
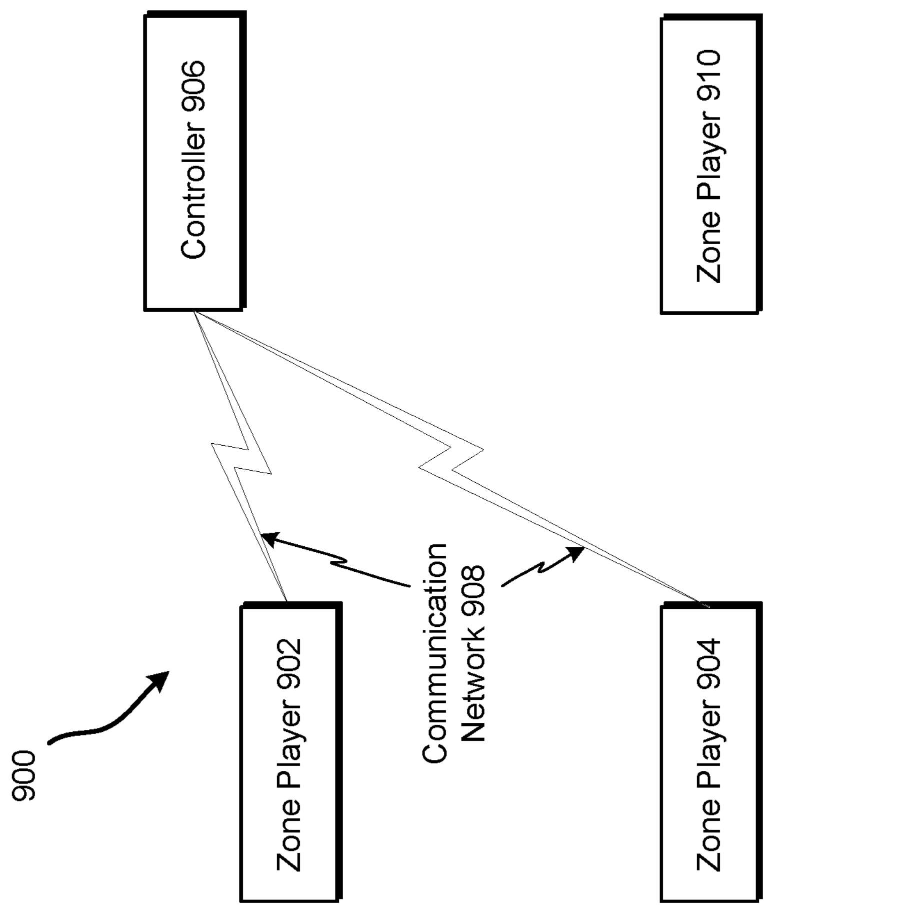
FIG. 9 shows an example system diagram for illustrating several volume enhancement embodiments.

FIG. 9 shows an example system 900 that includes zone player 902, zone player 904, zone player 910, and controller 906. The example system 900 is intended to be illustrative only, and can include more or less components like zone players and controllers, such as described with respect to the earlier figures above. Additionally, it is understood that zone players 902, 904, and 910 can play audio independently or in groups as described above.

Figure 10:
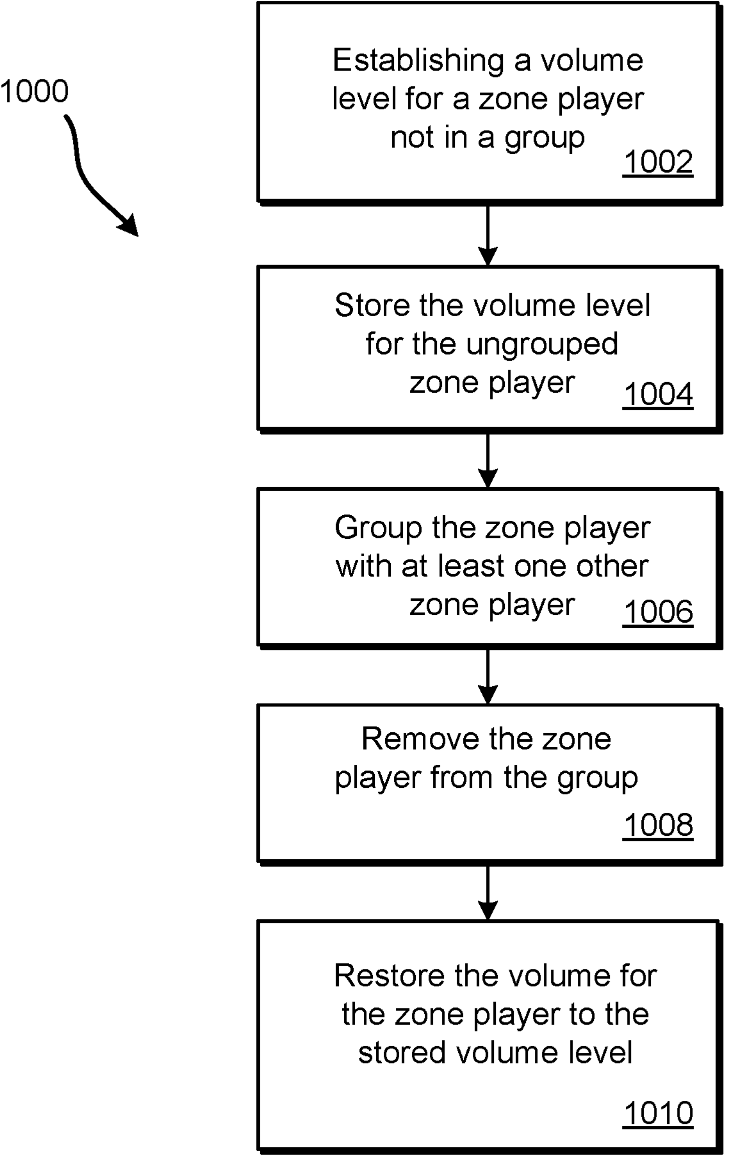
FIG. 10 shows an example process for setting a zone player volume level subsequent from removing the zone player from a group.

Now turning to method 1000 of FIG. 10 in view of system 900 shown in FIG. 9, a volume level is established for an ungrouped zone player at block 1002 in FIG. 10. To illustrate, assume that zone player 902 is currently not part of a synchronous audio playback group and a volume level is set for audio playback. The volume level may be input by a user into controller 906 and then transmitted from controller 906 to zone player 902 using, for example, a wired or wireless network technology 908, such as described above. Alternatively, the volume level may be input by a user on the zone player 902 directly using an interface on the zone player 902 if such an interface exists.

Before continuing with the example, it should be understood that a zone may be a bonded zone as described above, and as such the zone may comprise more than a single zone player. In an instance when a zone comprises two or more zone players (e.g., paired or consolidated), the volume level for the zone may be similarly established at block 1002 (as if the zone is a single zone player). According to one example, a stereo pairing between two zone players might have a single volume level for the pair. According to another example, a group containing two full-range audio playing zone players might have a single volume level for the group. As such, a "zone" may be substituted for a "zone player" in the figures and corresponding description.

According to block 1004, in one embodiment, the volume level is stored in memory of zone player 902. In another embodiment, the volume level is stored in memory of controller 906. In yet another embodiment, the volume level is stored at a remote server (not shown in FIG. 9). In some embodiments, the volume level may be stored on more than one device. Irrespective of which device or devices store the volume level for zone player 902, the zone player 902 is configured to retrieve and use the stored volume level when commanded to play audio.

According to block 1006, the zone player for which the volume level has been established and stored per blocks 1002 and 1004 is now grouped to another zone player. In the example of FIG. 9, zone player 902 is grouped with zone player 904 to synchronously playback audio (e.g., dining room 104 in FIG. 1 is grouped with kitchen 102). The command to group the zone players may be input by the user into controller 906 and then transmitted to any or all of zone players 902 and 904 using wired or wireless network technology 908, such as described above. At any time, the volume level for zone player 902 may change due to a direct change to the volume level setting for zone player 902 (while in the group) or to a group volume level change.

At block 1008, the zone player is removed from the group established in 1006. In the example of FIG. 9, we can assume zone player 902 is now removed from the group consisting of zone players 902 and 904. A command to remove the zone player 902 from the group may be input by the user into controller 906 and then transmitted to any or all of zone players 902 and 904 using wired or wireless network technology 908, such as described above.

At block 1010, the volume setting for zone player 902 is restored to the stored volume level per block 1004. In other words, the volume for audio playback by the now ungrouped zone player 902 is set back to the volume level just prior to grouping. In one embodiment, the zone player 902 retrieves the stored volume level from memory and makes the adjustment. In one embodiment, the zone player 902 may verify first whether a change in volume has occurred since the last ungrouping, and if not, then the volume setting is left alone. In another embodiment, the zone player 902 may simply override the volume setting regardless of whether the volume changed since the last ungrouping. In yet another embodiment, the zone player 902 may determine whether it is continuing to play the music of the group as a stand-alone player, and if so, then the volume setting is left alone. In this embodiment, the volume level that is stored for the zone player may be updated to reflect the current volume level.

Figure 11:
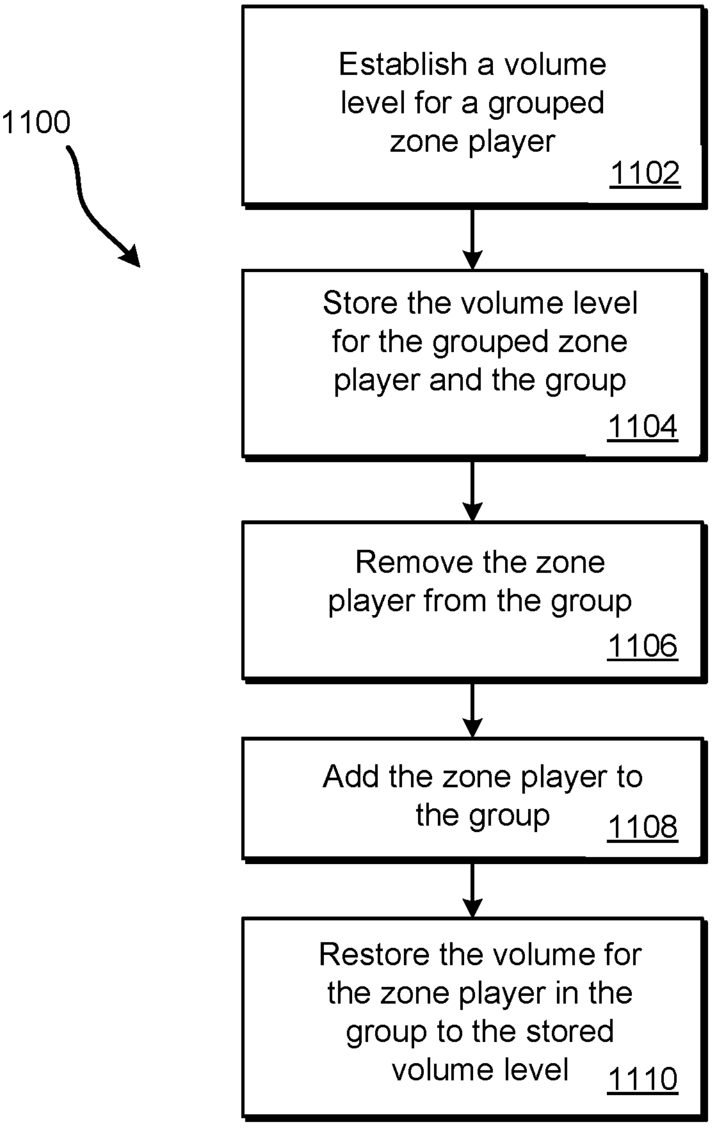
FIG. 11 shows an example process for setting a zone player volume level subsequent to grouping the zone player.

FIG. 11 shows another method 1100 to consider in view of system 900 of FIG. 9. Let us assume that zone players 902 and 904 are now grouped (e.g., see also block 1006 of FIG. 10 to see when the two zone players were grouped in that example). At block 1102, a volume level for the group is established and can even change upon a user's request for the duration of the group. When a volume level is set for the group, or zone player 902 while in the group, then the volume level for zone player 902 and the associated group is stored per block 1104. Information may be stored in a table that identifies the particular group (e.g., a group consisting of zone players 902 and 904) and the volume setting for zone player 902.

Per block 1106, the zone player 902 is removed from the group formed per the example of FIG. 11. By way of illustration, one decides to ungroup the kitchen 102 in FIG. 1 from the dining room 104 to listen to music in the kitchen 102 without playing the audio in the dining room 104.

Subsequently, let us assume that the zone player 902 is regrouped with zone player 904 per block 1108. Responsively, the system identifies that the group is established and restores the volume setting for zone player 902 to the stored value for the group. In another embodiment, the zone player 902 may determine whether it is continuing to play the music of the stand-alone player as the group music, and if so, then the volume level setting for zone player 902 is left alone and the volume level setting for the group is adjusted based on the volume level for the zone player 902.

In some embodiments, as groups are formed, the table includes the groups and the volume level settings for the zone player or each zone player if the table is universally shared among the system. An example table showing volume settings for zone player 902 by itself and in various group configurations is shown below (the table entries are only illustrative and may comprises shorter and/or different entries):

| Zone Configuration | Volume Level Setting |
|---|---|
| Zone player 902 | 50% |
| Zone player 902 in group consisting of zone players 902 and 904 | 35% |
| Zone player 902 in group consisting of zone players 902, 904, and 906 | 32% |

Looking to the table above, when the zone player 902 is playing audio by itself, the volume level is set to 50% until a change by a user is made. If a change is made, then the table can be updated to reflect the change. When the zone player 902 is grouped with zone player 904, then the volume level for zone player 902 is set to 35% until a change, if any, is made by the user. Similarly, when the zone player 902 is grouped with zone players 904 and 906, then the volume level for zone player 902 is set to 32% until a change, if any, is made by the user.

As described above, in some embodiments, a zone may be substituted for zone player. To illustrate, kitchen 102 in FIG. 1 might be substituted for zone player 902, dining room for zone player 904, and family room for zone player 906. When playing audio in the kitchen zone, the audio would be set to 50% according to the table above. When playing the same audio in the kitchen zone and the dining room zone, the kitchen zone volume level would be set to 35%. When playing the same audio across the kitchen, dining room, and family room zones, the kitchen volume level would be set to 32%.

In a similar manner, the group volume for specific groups may be stored. Recall that in some embodiments a zone player volume is determined based on the group volume (if the zone player is grouped). That is, a change to the group volume affects the individual zone player volumes, and in some embodiments, a change to the individual zone player volumes may affect the group volume. In some embodiments, the group volume may be used along with other volume settings to derive, for example, a volume level for a newly added player to a group. The user can still change the new player's volume level, but it provides a best guess as to an appropriate volume level. The new group information can further be stored in the table.

In the examples described above, the volume levels referred mostly to an absolute volume level. In some embodiments, the volume level may instead refer to a proportion of volume to other players in a particular group. For example, based on historical volume level setting data, a table may contain information that zone player 902 is to be set to 20% less volume than zone player 904. Then, when the group consisting of zone payers 902 and 904 is established (again), one of the players can adjust its volume level relative to the device being joined with. In this example, the volume level of the first zone player in the group can be used as the base and the volume level of the second zone player is determined using the proportion value and the volume level of the first zone player. As such, either zone player 902 or 904 could be used as the base depending on how the user forms the group. An advantage of using the first zone player in the group as the base allows the user to set the group volume based on the volume setting of the zone player(s) that he or she is likely hearing at the time of group formation (e.g., the user is in the living room and starts with the living room zone player to form a group). The proportional values can change as the user changes the volume levels for the zone players in the group.

A table below shows an example for proportional volume settings. The table may include information for a particular zone player (as shown below), in which case, each zone player would be associated with its own table. In another embodiment, a table may include the volume information for all of the zone players in a system. In the table below, if a zone group is started with zone player 904 and zone player 902 is added, then the volume level for zone player 902 is set to 10% of the current volume setting of zone player 904. Similarly, if a group includes more than two zone players, then volume settings in relation to the other players can be included, such as shown below with respect to group containing zone players 902, 904, and 906. In this example, the volume setting for zone player 902 need only be set relative to one of the players in the group (e.g., either 904 or 906), and that player may be selected, for example, based on the order in which the group was formed, based on a random or pseudo-random selection, or some other method.

| Zone Configuration | Volume Setting |
|---|---|
| Zone player 902 in group consisting of zone players 902 and 904 | 10% relative to zone player 904 |
| Zone player 902 in group consisting of zone players 902, 904, and 906 | 11% relative to zone player 904<br>13% relative to zone player 906 |

It is understood that information pertaining to both absolute volume levels and proportional volumes may be used together. In one example, assume that a system is programed to perform the following: when a group is re-formed, the volume level of the first zone player in the group is set to a previously stored value (an absolute volume level) and the other zone player(s) are set in proportion to the first zone player. In another example, assume that a system is programmed to perform the following: the volume level for each zone player in a group is set to its stored volume level (their individual, absolute volume levels), but a change to any one of the zone players affects the volume setting of the other zone players based on the proportional volume level.

The information pertaining to both types of volume settings can be stored in a table for reference by the system.

It is also understood that a table, or some other similarly suitable storing/organizing mechanism, may be stored locally in memory at each zone player, locally in memory at a selected one or more zone players, locally in memory at one or more controllers, or in memory at a remote server(s) that is accessible by the system. In some embodiments, each zone player stores only its associated volume setting information. In some embodiments, each zone player stores volume setting information for itself and other zone players in the system. In some embodiments, volume setting information is passed around the system (e.g., in a round-robin fashion; e.g., on an as-needed basis).

In another embodiment, when grouping zone players, the volume level of the zone players are set to the base zone player. For example, assume that zone player 902 has a current volume level of 30% and zone player 904 has a current volume level of 55%. When a user groups zone players 902 and 904, starting with zone player 902, then the volume level of zone player 904 is modified to 30%, which is the same as the volume level of zone player 902.

Figure 12:
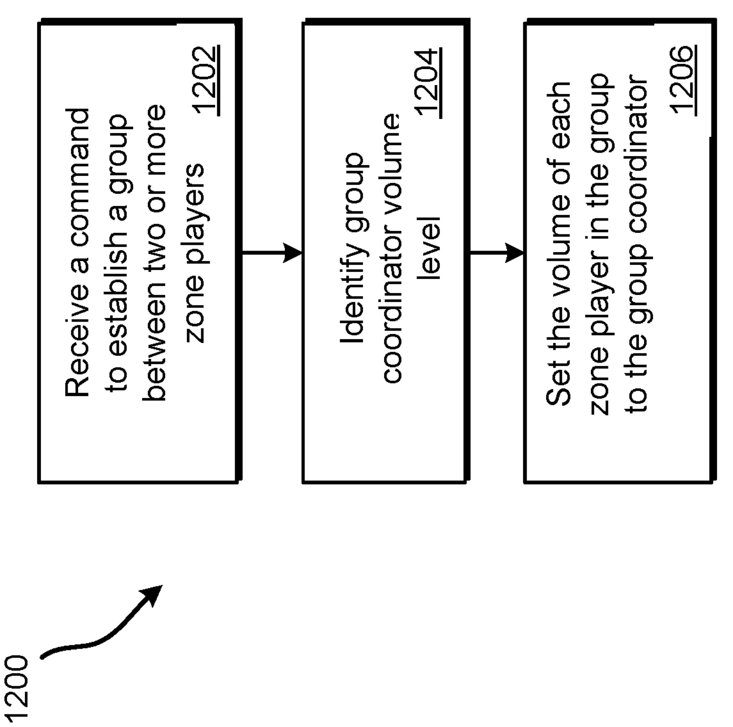
FIG. 12 shows an example process for setting a volume level of each zone player in a group.

FIG. 12 shows an example method 1200 for setting volume levels in a group according to this embodiment. At block 1202, a group is established between two or more zone players. At block 1204, a group coordinator is identified. In some embodiments, the group coordinator, or base zone player, is the first zone player in the group formation. In some embodiments, the base zone player is the zone player with the lowest volume setting (or alternatively, the highest volume setting or some other predefined volume level). At block 1206, the volume level of each zone player is set to the base zone player volume.

In an alternative embodiment, the volume level of each zone player is set to a predefined volume level. For example, each zone player may be set to a volume level previously set by the user for group volume. In another example, each zone player may be set to a volume level based on a historical number, such as an average group volume level.

In the embodiments described above, it is possible for a zone player to have a volume level setting without playing audio. When the zone player is used for audio playback, the zone player will use the volume level unless otherwise changed by the user.

IX. Conclusion

The description above discloses various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

As indicated above, the present application and the inventions described herein involve numerous volume enhancement embodiments that can be applied to a multi-zone player system that is capable of establishing synchronous audio playback groups amongst zone players. In one aspect, a method is provided. In one instance, the method involves establishing a synchronous audio playback group between a first zone player and at least a second zone player; receiving a first volume level for the first zone player for audio playback in the synchronous audio playback group; and storing the first volume level associated with the first zone player and the synchronous audio playback group, wherein the stored first volume level is used by the first zone player in a subsequent grouping between the first and second zone players.

Another method includes receiving a volume level for a zone player prior to grouping, where the zone player is configured to play audio according to the volume level; and storing the volume level prior to grouping, wherein the volume level is used by the zone player when the zone player is removed from the synchronous audio playback group.

Yet another method includes establishing a synchronous audio playback group between a first zone player, a second zone player, and a third zone player; receiving a second volume level for the first zone player while in the synchronous audio playback group comprising the first, second, and third zone players; storing the second volume level associated with the first zone player and the synchronous playback group comprising the first, second, and third zone players, wherein the stored second volume level is used by the first zone player in a subsequent grouping between the first, second, and third zone players.

In another aspect, a system is provided. The system includes zone players and controllers for establishing a synchronous audio playback group between a first zone player and at least a second zone player; receiving a first volume level for the first zone player for audio playback in the synchronous audio playback group; and storing the first volume level associated with the first zone player and the synchronous audio playback group, wherein the stored first volume level is used by the first zone player in a subsequent grouping between the first and second zone players.

In yet another aspect, a non-transitory computer readable memory is provided. The non-transitory computer readable memory has stored thereon instructions executable by a computing device to cause the computing device to perform functions. The functions include establishing a synchronous audio playback group between a first zone player and at least a second zone player; receiving a first volume level for the first zone player for audio playback in the synchronous audio playback group; and storing the first volume level associated with the first zone player and the synchronous audio playback group, wherein the stored first volume level is used by the first zone player in a subsequent grouping between the first and second zone players.

Additionally, references herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

The invention claimed is:

1. A first playback device comprising:

one or more processors;

tangible, non-transitory computer readable media comprising program instructions executable by the one or more processors such that the first playback device is configured to:

following the first playback device joining a playback group comprising the first playback device and a second playback device, play first audio content at a first volume level;

in response to the first playback device leaving the playback group comprising the first playback device and the second playback device, determine whether the first playback device is continuing to play the first audio content;

in response to a determination that the first playback device is continuing to play the first audio content following the first playback device leaving the playback group comprising the first playback device and the second playback device, continue to play the first audio content at the first volume level; and in response to a determination that the first playback device is not continuing to play the first audio content following the first playback device leaving the playback group comprising the first playback device and the second playback device, (i) retrieve a second volume level that was stored prior to the first playback device joining the playback group comprising the first playback device and the second playback device, and (ii) adjust a playback volume level of the first playback device to the second volume level for playing second audio content that is different than the first audio content, wherein the first volume level is different than the second volume level.

2. The first playback device of claim 1, wherein the program instructions executable by the one or more processors such that the first playback device is configured to, following the first playback device joining the playback group comprising the first playback device and the second playback device, play the first audio content at the first volume level comprise program instructions executable by the one or more processors such that the first playback device is configured to, following the first playback device joining the playback group comprising the first playback device and the second playback device, play the first audio content at the first volume level in synchrony with the second playback device.

3. The first playback device of claim 2, wherein the program instructions executable by the one or more processors such that the first playback device is configured to, following the first playback device joining the playback group comprising the first playback device and the second playback device, play the first audio content at the first volume level in synchrony with the second playback device comprise program instructions executable by the one or more processors such that the first playback device is configured to, following the first playback device joining the playback group comprising the first playback device and the second playback device, play the first audio content at the first volume level while the second playback device plays identical first audio content.

4. The first playback device of claim 2, wherein the program instructions executable by the one or more processors such that the first playback device is configured to, following the first playback device joining the playback group comprising the first playback device and the second playback device, play the first audio content at the first volume level in synchrony with the second playback device comprise program instructions executable by the one or more processors such that the first playback device is configured to, following the first playback device joining the playback group comprising the first playback device and the second playback device, play a first channel of the first audio content while the second playback device plays a second channel of the first audio content.

5. The first playback device of claim 1, wherein the second volume level is identical to a previous volume level used by the first playback device prior to the first playback device joining the playback group comprising the first playback device and the second playback device.

6. The first playback device of claim 1, wherein the program instructions comprise program instructions executable by the one or more processors such that the first playback device is configured to:

while the first playback device is in the playback group comprising the first playback device and the second playback device, adjust the first volume level based on one or more commands to adjust a group volume of the playback group, wherein a change to the group volume affects the volume level of each playback device in the playback group.

7. The first playback device of claim 6, wherein the one or more commands to adjust the group volume of the playback group comprise one or more voice commands to adjust the group volume of the playback group.

8. The first playback device of claim 1, wherein the program instructions comprise program instructions executable by the one or more processors such that the first playback device is configured to:

while the first playback device is in the playback group comprising the first playback device and the second playback device, adjust the first volume level based on one or more commands to adjust the first volume level of the first playback device.

9. The first playback device of claim 8, wherein the one or more commands to adjust the first volume level of the first playback device comprise one or more voice commands to adjust the first volume level of the first playback device.

10. Tangible, non-transitory computer-readable media storing instructions executable by one or more processors to cause a first playback device to perform functions comprising:

following the first playback device joining a playback group comprising the first playback device and a second playback device, playing first audio content at a first volume level;

in response to the first playback device leaving the playback group comprising the first playback device and the second playback device, determining whether the first playback device is continuing to play the first audio content;

in response to a determination that the first playback device is continuing to play the first audio content following the first playback device leaving the playback group comprising the first playback device and the second playback device, continuing to play the first audio content at the first volume level; and in response to a determination that the first playback device is not continuing to play the first audio content following the first playback device leaving the playback group comprising the first playback device and the second playback device, (i) retrieving a second volume level that was stored prior to the first playback device joining the playback group comprising the first playback device and the second playback device, and (ii) adjusting a playback volume level of the first playback device to the second volume level for playing second audio content that is different than the first audio content, wherein the first volume level is different than the second volume level.

11. The tangible, non-transitory computer-readable media of claim 10, wherein playing the first audio content at the first volume level comprises playing the first audio content at the first volume level in synchrony with the second playback device.

12. The tangible, non-transitory computer-readable media of claim 11, wherein playing the first audio content at the first volume level in synchrony with the second playback device comprises playing the first audio content at the first volume level while the second playback device plays identical first audio content.

13. The tangible, non-transitory computer-readable media of claim 11, wherein playing the first audio content at the first volume level in synchrony with the second playback device comprises playing a first channel of the first audio content while the second playback device plays a second channel of the first audio content.

14. The tangible, non-transitory computer-readable media of claim 10, wherein the second volume level is identical to a previous volume level used by the first playback device prior to the first playback device joining the playback group comprising the first playback device and the second playback device.

15. The tangible, non-transitory computer-readable media of claim 10, wherein the functions further comprise:

while the first playback device is in the playback group comprising the first playback device and the second playback device, adjusting the first volume level based on one or more commands to adjust a group volume of the playback group, wherein a change to the group volume affects the volume level of each playback device in the playback group.

16. The tangible, non-transitory computer-readable media of claim 15, wherein the one or more commands to adjust the group volume of the playback group comprise one or more voice commands to adjust the group volume of the playback group.

17. The tangible, non-transitory computer-readable media of claim 10, wherein the functions further comprise:

while the first playback device is in the playback group comprising the first playback device and the second playback device, adjusting the first volume level based on one or more commands to adjust the first volume level of the first playback device.

18. The tangible, non-transitory computer-readable media of claim 17, wherein the one or more commands to adjust the first volume level of the first playback device comprise one or more voice commands to adjust the first volume level of the first playback device.

19. A method performed by a first playback device, comprising:

following the first playback device joining a playback group comprising the first playback device and a second playback device, playing first audio content at a first volume level;

in response to the first playback device leaving the playback group comprising the first playback device and the second playback device, determining whether the first playback device is continuing to play the first audio content;

in response to a determination that the first playback device is continuing to play the first audio content following the first playback device leaving the playback group comprising the first playback device and the second playback device, continuing to play the first audio content at the first volume level; and in response to a determination that the first playback device is not continuing to play the first audio content following the first playback device leaving the playback group comprising the first playback device and the second playback device, (i) retrieving a second volume level that was stored prior to the first playback device joining the playback group comprising the first playback device and the second playback device, and (ii) adjusting a playback volume level of the first playback device to the second volume level for playing second audio content that is different than the first audio content, wherein the first volume level is different than the second volume level.

20. The method of claim 19, wherein the second volume level is identical to a previous volume level used by the first playback device prior to the first playback device joining the playback group comprising the first playback device and the second playback device.

* * * * *